(12) United States Patent
Shieh et al.

(10) Patent No.: US 9,755,004 B2
(45) Date of Patent: *Sep. 5, 2017

(54) FULL-COLOR ACTIVE MATRIX ORGANIC LIGHT EMITTING DISPLAY WITH HYBRID STRUCTURE

(71) Applicant: CBRITE Inc., Goleta, CA (US)

(72) Inventors: Chan-Long Shieh, Paradise Valley, AZ (US); Gang Yu, Santa Barbara, CA (US)

(73) Assignee: CBRITE Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/009,323

(22) Filed: Jan. 28, 2016

(65) Prior Publication Data

US 2016/0163774 A1 Jun. 9, 2016

Related U.S. Application Data

(60) Continuation of application No. 14/288,577, filed on May 28, 2014, now Pat. No. 9,257,490, which is a
(Continued)

(51) Int. Cl.
*H01J 1/62* (2006.01)
*H01J 63/04* (2006.01)
(Continued)

(52) U.S. Cl.
CPC ........ *H01L 27/3218* (2013.01); *H01L 27/322* (2013.01); *H01L 27/3262* (2013.01);
(Continued)

(58) Field of Classification Search
CPC .......................... H01L 27/322; H01L 27/3244
See application file for complete search history.

(56) References Cited

U.S. PATENT DOCUMENTS 6,137,221 A 10/2000 Roitman et al.
6,911,666 B2 6/2005 Voutsas
(Continued)

FOREIGN PATENT DOCUMENTS

CN 1638551 A 7/2005
CN 1741690 A 3/2006
(Continued)

OTHER PUBLICATIONS

US Notice of Allowance dated Mar. 8, 2011 for U.S. Appl. No. 12/178,209.
(Continued)

*Primary Examiner* — Joseph L Williams
(74) *Attorney, Agent, or Firm* — Weaver Austin Villeneuve & Sampson LLP

(57) ABSTRACT

A full-color AM OLED includes a transparent substrate, a color filter positioned on an upper surface of the substrate, and a metal oxide thin film transistor backpanel positioned in overlying relationship on the color filter and defining an array of pixels. An array of OLEDs is formed on the backpanel and positioned to emit light downwardly through the backpanel, the color filter, and the substrate in a full-color display. Light emitted by each OLED includes a first emission band with wavelengths extending across the range of two of the primary colors and a second emission band with wavelengths extending across the range of the remaining primary color. The color filter includes for each pixel, two zones separating the first emission band into two separate primary colors and a third zone passing the second emission band.

38 Claims, 4 Drawing Sheets

Related U.S. Application Data division of application No. 13/170,382, filed on Jun. 28, 2011, now Pat. No. 8,742,658.

(51) Int. Cl.
*H01J 9/24* (2006.01)
*H01L 27/32* (2006.01)
*H01L 51/52* (2006.01)
*H01L 27/12* (2006.01)

(52) U.S. Cl.
CPC ...... *H01L 27/3265* (2013.01); *H01L 51/5284* (2013.01); *H01L 27/1225* (2013.01); *H01L 27/1255* (2013.01); *H01L 27/3244* (2013.01)

(56) References Cited

U.S. PATENT DOCUMENTS

| | | |
|---|---|---|
| 7,026,658 B2 | 4/2006 | Park et al. |
| 7,167,169 B2 | 1/2007 | Libsch et al. |
| 7,420,322 B2 | 9/2008 | Takei et al. |
| 7,649,311 B2 | 1/2010 | Park et al. |
| 7,977,868 B2 | 7/2011 | Shieh et al. |
| 8,203,261 B2 | 6/2012 | Tanaka et al. |
| 8,263,433 B2 | 9/2012 | Yeh et al. |
| 8,742,658 B2 | 6/2014 | Shieh et al. |
| 8,827,488 B2 | 9/2014 | Weaver et al. |
| 9,257,490 B2 | 2/2016 | Shieh et al. |
| 9,385,167 B2 | 7/2016 | Hack et al. |
| 2002/0024051 A1 | 2/2002 | Yamazaki et al. |
| 2003/0030382 A1 | 2/2003 | Koyama |
| 2003/0107565 A1 | 6/2003 | Libsch et al. |
| 2004/0087066 A1 | 5/2004 | Voutsas |
| 2004/0155846 A1 | 8/2004 | Hoffman et al. |
| 2004/0263039 A1 | 12/2004 | Takei et al. |
| 2005/0140282 A1 | 6/2005 | Park et al. |
| 2005/0269945 A1 | 12/2005 | Su |
| 2006/0113549 A1 | 6/2006 | Den et al. |
| 2006/0138415 A1 | 6/2006 | Hung et al. |
| 2006/0284204 A1 | 12/2006 | Yamazaki et al. |
| 2007/0096636 A1 | 5/2007 | Park et al. |
| 2007/0152217 A1 | 7/2007 | Lai et al. |
| 2008/0218075 A1 | 9/2008 | Tyldesley et al. |
| 2008/0297042 A1 | 12/2008 | Ahn et al. |
| 2010/0019656 A1 | 1/2010 | Shieh et al. |
| 2010/0090620 A1 | 4/2010 | Hack et al. |
| 2010/0176412 A1 | 7/2010 | Yokoyama et al. |
| 2011/0248294 A1 | 10/2011 | Weaver et al. |
| 2011/0309389 A1 | 12/2011 | Shieh et al. |
| 2014/0273319 A1 | 9/2014 | Shieh et al. |

FOREIGN PATENT DOCUMENTS

| | | |
|---|---|---|
| CN | 1921140 A | 2/2007 |
| CN | 101022121 A | 8/2007 |
| CN | 101156194 A | 4/2008 |
| CN | 102105927 A | 6/2011 |
| JP | 2007-019016 | 1/2007 |
| JP | 2008-059824 | 3/2008 |
| JP | 2008-539554 | 11/2008 |
| JP | 2008-539555 | 11/2008 |
| JP | 2010-040520 | 2/2010 |
| JP | 2011-002689 | 1/2011 |
| KR | 2003-0013700 A | 2/2003 |

OTHER PUBLICATIONS

US Office Action dated Sep. 24, 2010 for U.S. Appl. No. 12/178,209.
CN Office Action dated Jan. 21, 2014 for CN Application No. 200980128733.0.
CN Office Action dated Jun. 12, 2014 for CN Application No. 200980128733.0.
CN Office Action dated Mar. 28, 2013 for CN Application No. 200980128733.0.
EP Search Report dated Apr. 22, 2013 in EP Application No. 09800927.7.
International Preliminary Report on Patentability dated Jan. 25, 2011 in PCT Application No. PCT/US09/51374.
International Search Report and Written Opinion dated Sep. 9, 2009 in PCT Application No. PCT/US09/51374.
US Final Office Action dated Jun. 12, 2013 for U.S. Appl. No. 13/170,382.
US Notice of Allowance dated Jan. 24, 2014 for U.S. Appl. No. 13/170,382.
US Office Action dated Nov. 13, 2012 for U.S. Appl. No. 13/170,382.
CN Office Action dated Oct. 27, 2015 for CN Application No. 201210224317.4.
US Notice of Allowance dated Oct. 1, 2015 for U.S. Appl. No. 14/288,577.
US Office Action dated Jun. 3, 2015 for U.S. Appl. No. 14/288,577.
JP Office Action dated Apr. 6, 2017 for JP Application No. 2012-141595.
JP Office Action dated May 10, 2016 for JP Application No. 2012-141595.
Kowalsky, W. et al., "See-through OLED displays," Proceedings of SPIE—International Society for Optical Engineering, vol. 6486, 2007, pp. 64860F/1-64860F/14.

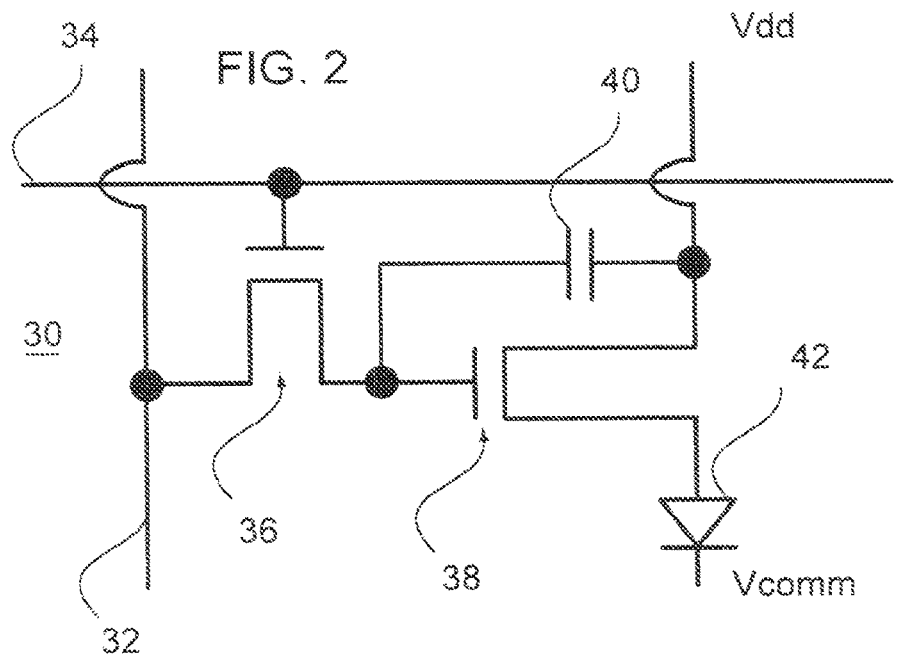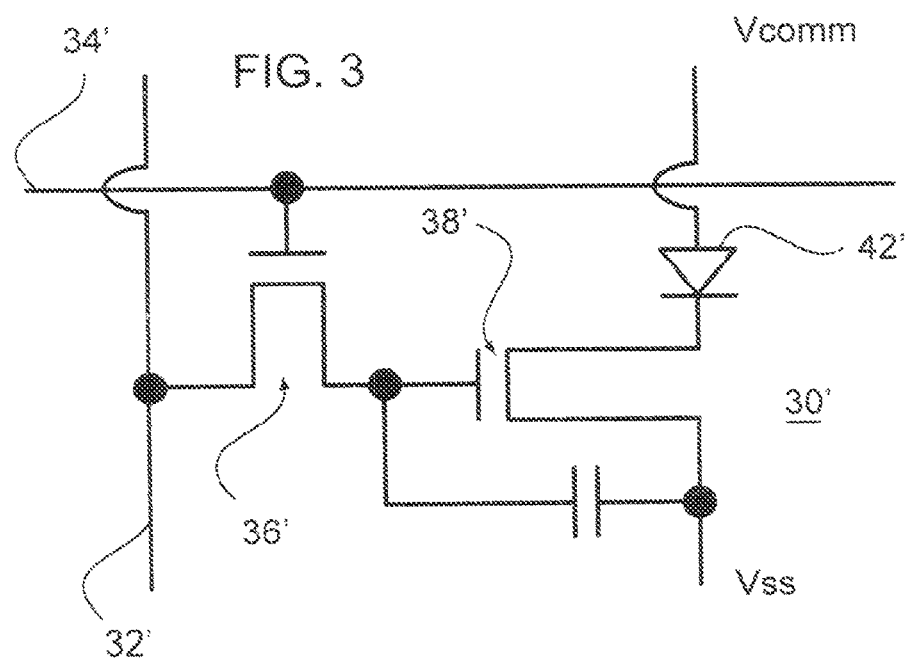

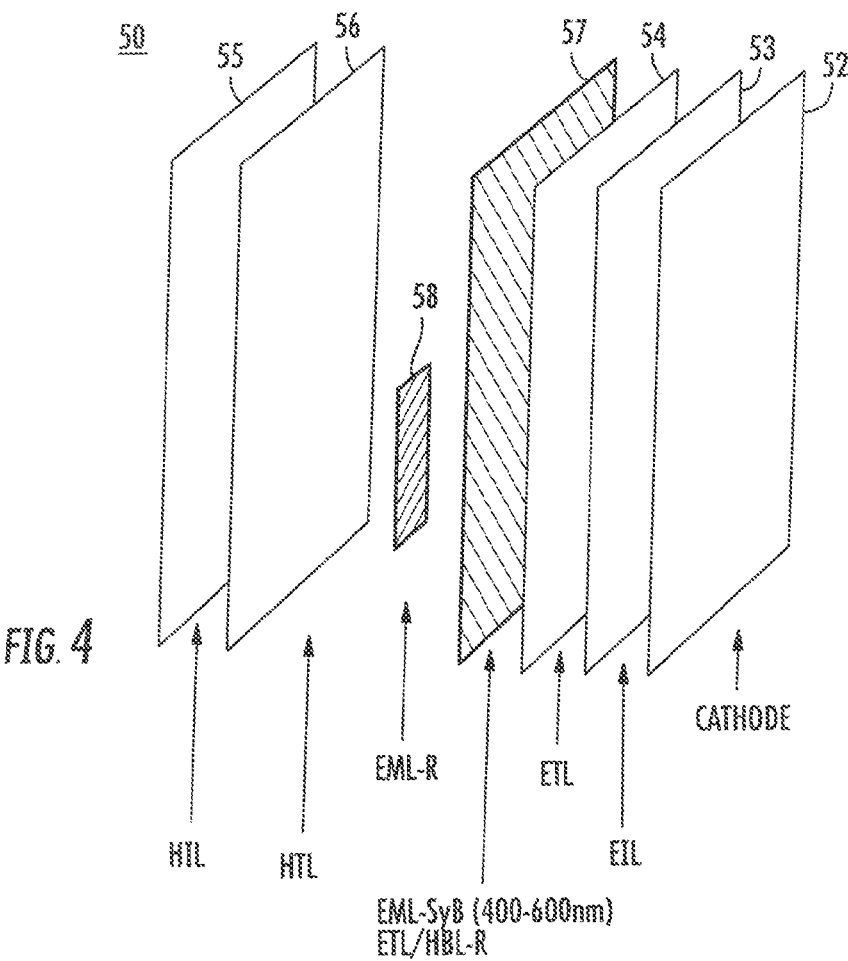
FIG. 4
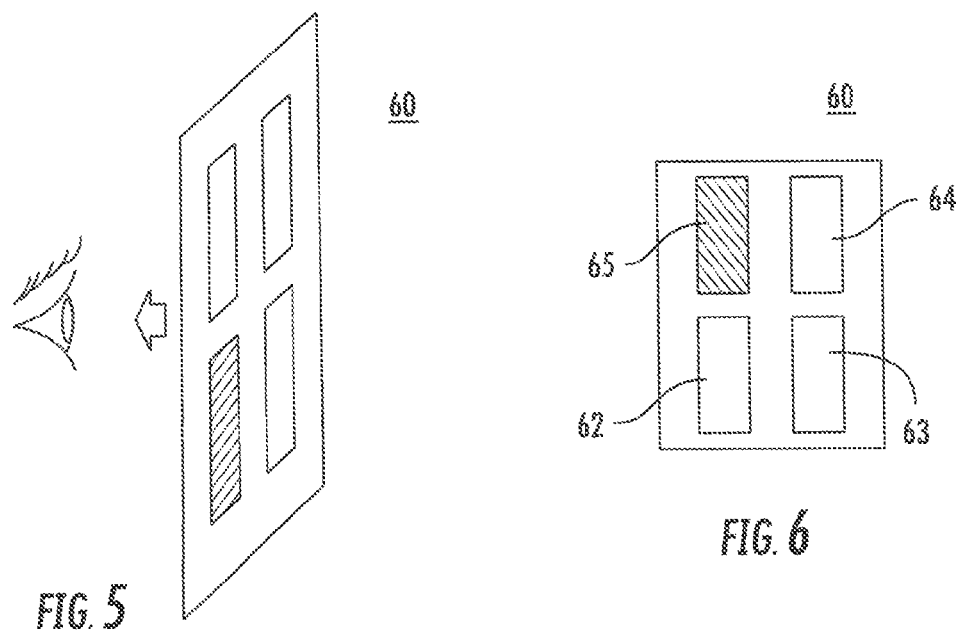
FIG. 5
FIG. 6

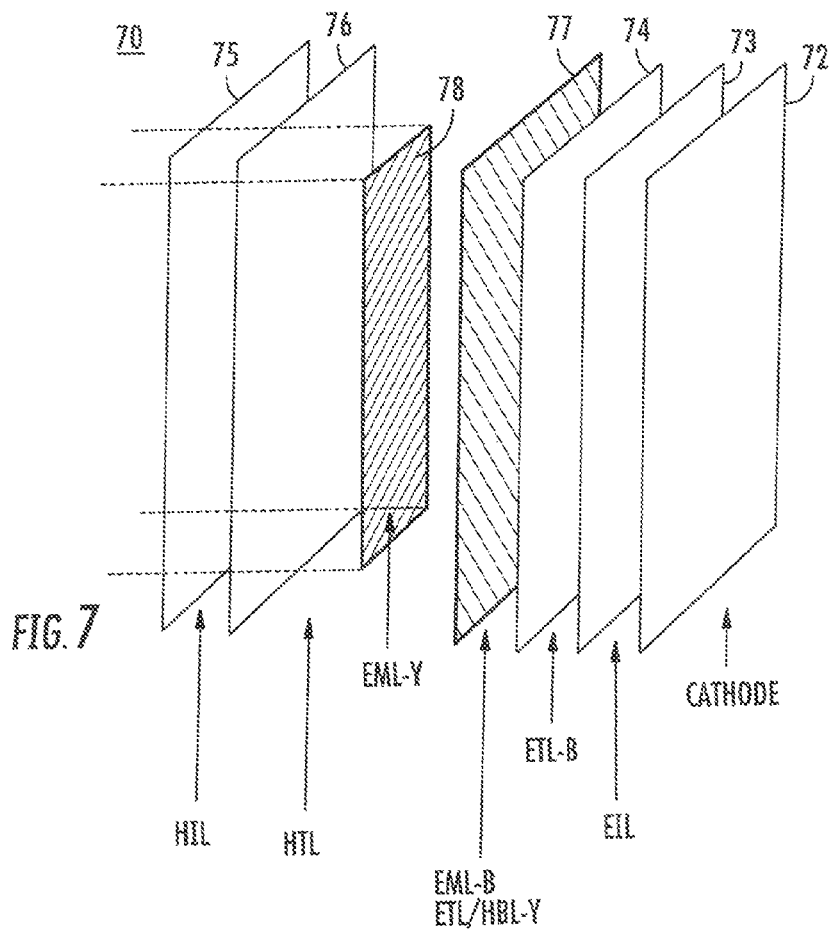
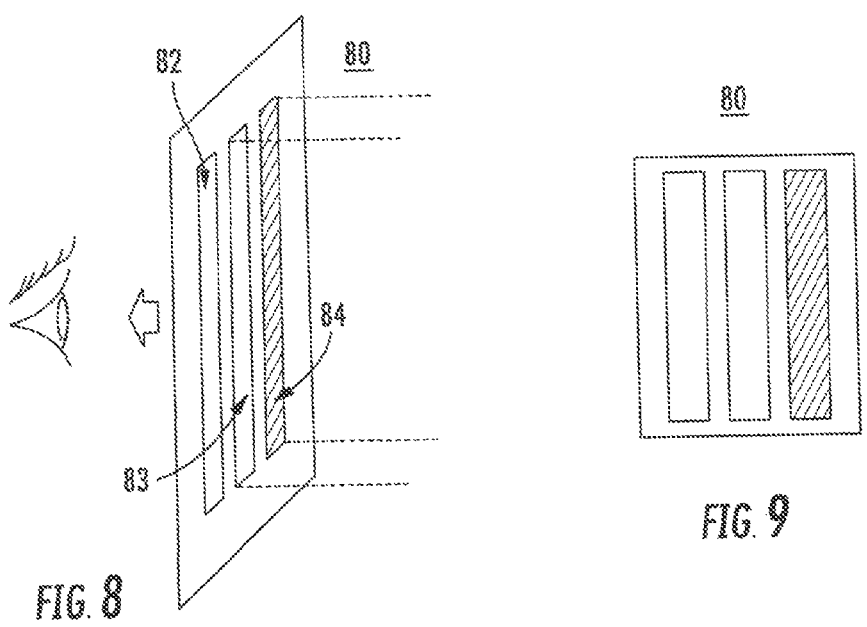

FULL-COLOR ACTIVE MATRIX ORGANIC LIGHT EMITTING DISPLAY WITH HYBRID STRUCTURE

CROSS-REFERENCE TO RELATED APPLICATIONS

This application is a continuation application of U.S. application Ser. No. 14/288,577, filed May 28, 2014 (issued as U.S. Pat. No. 9,257,490 on Feb. 9, 2016), which is a divisional application of U.S. application Ser. No. 13/170,382, filed on Jun. 28, 2011 (issued as U.S. Pat. No. 8,742,658 on Jun. 3, 2014).

FIELD OF THE INVENTION

This invention generally relates to a full-color organic light emitting display with metal oxide TFTs and a color filter.

BACKGROUND OF THE INVENTION

There is a strong interest in organic light emitting displays (OLED) because of the properties of organic light emitting devices. Generally, these devices are of very low current, low power, and high emission characteristics. Further, organic light emitting devices can be produced to emit virtually any color so that color displays are possible. As is understood by those skilled in the art, a color display requires arrays of full-color pixels each of which includes red, green, and blue sub-pixels. However, it is very difficult to fabricate organic light emitting devices in arrays of color pixels. At present the only practical method is to deposit the various layers of color material required by using a process known as 'fine shadow masking' or the use of a shadow mask to deposit the patterned color emitter layers. The major problem is that this shadow mask is very difficult to make and expensive. Secondly, this shadow mask can only be used for certain deposition cycles due to dimension deformation. Moreover, the shadow mask process has upper size limits that restrict the process to relatively small displays. On the other hand, displays for 3G or 4G multi-medium applications require sufficient pixel counts for each display, the mask alignment accuracy and the corresponding emitting color crosstalk set a limit to the size of red, green, and blue sub-pixels.

High information content color arrays use an active matrix type of pixel control and address system. Generally, because the controlling transistors are built into the array, thin film transistors (TFT) are used. In the prior art, poly-silicon is used for the switching and control transistors in active matrix OLED displays (AMOLED). However, poly-silicon requires relatively high temperatures to process, and, therefore, adjoining circuitry and substrates are severely limited. Also, the characteristics of transistors formed in poly-silicon can vary, even between adjacent devices in an array, because of the variation in crystal size and position. To better understand this problem, in a conduction area under a gate of a few microns length each different transistor can include from one or two poly-silicon crystalline grains to several crystalline grains and the different number of crystals in the conduction area will produce different characteristics. The dimensions and their physical characteristics among different grains are also different. In addition, poly-silicon is light sensitive, i.e. its I-V characteristic is changed by exposure to visible light. Amorphous silicon is also light sensitive so that devices fabricated from either of these materials require a light shield or light shielding, which further complicates the manufacturing process and reduces the aperture ratio (the emitting area over the pitch area). Small aperture ratio, in turn, requires the OLED be driven harder for a targeting display brightness and, thus, sets higher demand to OLED operation lifetime.

Fundamentally, a pixel driver for an active matrix organic light emitting display includes two transistors and a storage capacitor. One transistor serves as a switch and the other transistor serves as a current regulator for the OLED. A storage capacitor is connected between the gate and the drain (or the source) of the current regulator transistor to memorize the voltage on the data line after the switching transistor is turned off. Also, the pixel driver is connected to three bus lines, a scan or select line, a data line, and a power line, which are coupled to peripheral control circuitry. However, in the prior art, or the present state of active matrix organic light emitting displays, the pixel driver described cannot effectively be achieved with sufficient performance and/or at low cost.

Low temperature poly-silicon (LTPS) and amorphous silicon (a-Si) have been used to construct pixel driver circuits for active matrix organic light emitting display backpanels. In this context, the term "backpanel" refers to any array of switching circuits, generally arranged in column and row form, and each pixel or pixel element having a pixel electrode (either transparent or reflective to the emitted light) connected to an organic light emitting diode. At the present time all of the active matrix organic light emitting displays in the commercial market are fabricated with LTPS backpanels. Although LTPS provides sufficient operating lifetime needed for driving OLEDs, the "mura" defect caused by TFT performance inhomogeneity is much more serious for LTPS TFTs being used for driving OLEDs than for driving liquid crystal displays (LCDs). As a result, more than 2 transistors are often used in pixel drivers to compensate for the mura inhomogeneity. Also, in some applications more than three bus lines (data, selection, and power) are included for compensation circuitry. Further, LTPS backpanels require larger storage capacitors due to relatively higher "OFF" current in the switching transistors. Although higher mobility in LTPS backpanels allows transistors with shorter width/length (W/L) ratio, the higher OFF-current in the switching transistors requires multiple gate design (e.g. a TFT with 2 or 3 gate electrode in comb pattern between source and drain electrodes) and thus larger space between source and drain electrodes. Thus, the effective area needed for each pixel driver is substantial compared to the total pitch area. Thus, the OLED emitter has to be arranged or stacked with the pixel driver for light emission from the top. The small energy gap of LTPS also requires that LTPS TFTs are shielded from the light being emitted as well as from ambient light.

There has been significant effort to fabricate active matrix organic light emitting display backpanels using a-Si TFTs. However, the I-V (current-voltage) performance in a-Si TFTs is not stable under DC operation (Vth shift and mobility decrease due to defect density increase) so that it is hard to use a-Si TFTs for the driver or current regulator transistor in the backpanel. Pixel control circuits with more transistors, capacitors, and buslines have been proposed to stabilize the transistor performance but none of them have demonstrated the stability needed for commercial applications. The low carrier mobility (~0.1 to 0.7 $cm^2/Vsec$) also requires larger W/L ratio (and thus larger TFT size) for the driver or current regulator transistor. As a result, there is not sufficient room for an OLED emitted pad for a bottom emission so that a top emission configuration has to be used.

In the top emission active matrix organic light emitting display design, a planarization layer is needed to separate the TFT from the bottom electrode of the OLED emitter to eliminate optical and electrical crosstalk between the two portions. Two to three photo processes are needed to make vias through the planarization layer and to pattern the bottom electrode for the OLED. There is often another 1 to 2 photo process steps to construct a bank structure for full-color OLED processing (such as a well used to confine organic emitter ink when inkjet printing is used to pattern full-color emitter layers). Since the bulk conductivity of transparent top electrode (typically made of indium-tin-oxide or aluminum-zinc-oxide) is not sufficient for the common electrode to pass current from pixels to peripheral driver chips, another via is often needed and another metal bus line is thus needed on the backpanel. This design severely limits the aperture ratio of the top emission active matrix organic light emitting display products to ~50% range. Here "aperture ratio" means a ratio of emission zone over the sub-pixel pitch size. Moreover, depositing transparent metal oxide onto OLED layers is typically done by a sputtering process, retaining OLED performance (both power efficiency and operation lifetime) in top electrode process is one of the remaining challenges.

There is, thus, a strong interest in a bottom emission active matrix organic light emitting display architecture with sufficient aperture ratio for the OLED pad, and with low cost processes at least competitive to other display technologies, such as active matrix liquid crystal displays.

It would be highly advantageous, therefore, to remedy the foregoing and other deficiencies inherent in the prior art.

Accordingly, it is an object of the present invention to provide a new and improved full-color, active matrix organic light emitting display.

It is another object of the present invention to provide a new and improved full-color, active matrix organic light emitting display which is relatively simple and inexpensive to manufacture and which results in higher fabrication yields.

It is another object of the present invention to provide a new and improved full-color, active matrix organic light emitting display utilizing pixel control circuits with relatively uniform characteristics.

It is another object of the present invention to provide a new and improved full-color, active matrix organic light emitting display that can be constructed with relatively large areas.

It is another object of the present invention to provide a new and improved full-color, active matrix organic light emitting display that can be constructed with high pixel density.

It is another object of the present invention to provide a new and improved full-color, active matrix organic light emitting display with bottom emission and relatively high aperture ratio.

It is another object of the present invention to provide a new and improved full-color, active matrix organic light emitting display requiring low cost processes at least competitive to other display technologies.

It is another object of the present invention to provide a new and improved full-color, active matrix organic light emitting display with higher switch rate and higher frame rate beyond 60 Hz (higher carrier mobility in MO-TFT enables the frame rate to 120 Hz or beyond).

It is another object of the present invention to design a full-color, AMOLED with optimized energy efficiency, color gamut, operation lifetime in addition to the lowest manufacturing cost and highest manufacturing yield, i.e. a full-color AMOLED with the best performance/cost ratio.

SUMMARY OF THE INVENTION

Briefly, to achieve the desired objects of the instant invention in accordance with a preferred embodiment thereof, provided is a full-color active matrix organic light emitting display including a transparent substrate, a color filter positioned on an upper surface of the substrate, and a metal oxide thin film transistor backpanel positioned in overlying relationship on the color filter and defining an array of pixels. An array of organic light emitting devices is formed on the backpanel and positioned to emit light downwardly through the backpanel, the color filter, and the substrate in a full-color display.

The array of light emitting pixels is categorized in two sub-groups with a first subgroup emitting light in a first wavelength zone and a second subgroup emitting light in a second wavelength zone, the second wavelength zone having a longer wavelength than the first wavelength zone. The light emitting layer (first subgroup) in the OLED stacks responsible for the first emission zone is made with an up-patterned film forming method. While the second subgroup of emitting pixels is formed with the corresponding light emission layer patterned at full-color pixel level with thermal deposition through a shadow mask, or with one of the printing methods using an electroluminescent ink.

Traditionally, a full-color display pixel is constructed with three color primaries or subgroups (referred to herein as sub-pixels) emitting in blue (400-500 nm), green (500-600 nm), and red (600-700 nm). One approach to achieve such primary colors in the prior art is from a white OLED emitter plus a color filter set. To achieve the needed color purity, one has to cut the emission profile from both the long and short wavelength sides and shape the emission profile according to display color standards (i.e. generating sufficiently pure white light is not a simple task). Further, the filtering of the white light to obtain the three primary colors results in a substantial loss of light (as much as two thirds). The challenges for such an approach are that no sufficient light or power efficiency could be achieved for product requirements.

In the present invention, a new method is disclosed of forming two primary-color sub-pixels from an OLED with emission profile covering two primary colors (for example, with a profile bandwidth in the 100-200 nm range), along with a pair of long-pass and short-pass wavelength optical filters having a cut-off near the middle of the emission profile. In contrast to the prior art, the optical filters utilized in this invention do not absorb light in the transmission band. The desired emission profile can be achieved with a color filter that only cuts light emitted in the unwanted region, but no light absorption occurs in the transmission region. The energy efficiency of the full-color display is thus optimized.

Only one fine patterning at full-color pixel level is involved in fabricating such a full-color AMOLED array, in contrast to the conventional 3 patterning steps required for OLEDs with red, green, and blue emitting materials. The full-color architecture and the corresponding fabrication process are thus simplified significantly. This process also allows an existing AMOLED fabrication line based on 3 fine patterning steps to improve the throughput (or a reduction of the corresponding manufacturing cost) by 3 times. Such process simplification also improves the process yield.

In one arrangement of the preferred embodiment of the full-color active matrix organic light emitting display, the organic emitting material for the first emission zone is chosen to cover the 400-600 nm range. Similar to other layers in the OLED stack, the emission layer is deposited without a fine patterning process. A red emitting material with an emission profile in the 600-700 nm range is formed in a location corresponding to that for red pixels with one of the known patterning means or techniques. The OLED emitter arrays are classified into two subgroups with the first group of pixels emitting sky-blue color (the emission profile in the 400-600 nm range) and the second group of pixels emitting red color (emission profile in the 600-700 nm range). A full-color display pixel comprising red, green, and blue sub-pixels can be achieved by combining such two color OLED arrays with a set of color filters in corresponding pixel locations. The color filter layer corresponding to the red pixels can be left open, or with a filter just trimming the red OLED emitter further to maximize the color gamut. A long-wavelength-pass filter with cut-off wavelength near 500 nm is placed in front of the sky-blue emitter to achieve the desired green color. A short-wavelength-pass filter with cut-off wavelength near 500 nm is placed in front of the sky-blue emitter to achieve the desired blue color. To maximize display efficiency and enrich the color gamut of the display, one could also add a fourth sub-pixel with the sky-blue emitter unfiltered (i.e. no optical filter).

In another arrangement of the preferred embodiment of the full-color active matrix organic light emitting display, the organic emitting material for the first emission zone is chosen to cover the 400-500 nm emission range. Similar to other layers in the OLED stack, this emission layer is deposited without a fine patterning process. A yellow emitting material with emission profile in a 500-700 nm range is formed in a location corresponding to that for green and red pixels with one of the standard patterning methods. The OLED emitter arrays are classified into two subgroups with the first subgroup of pixels emitting blue color (an emission profile in the 400-500 nm range) and the second subgroup of pixels emitting yellow color (an emission profile in the 500-700 nm range). A full color display pixel comprising red, green, and blue sub-pixels can be achieved by combining the two color OLED array with a set of color filters in corresponding pixel locations. The color filter layer corresponding to the blue pixel can be left open, or with a filter just trimming the blue OLED emitter further to desired color coordinates. A long-wavelength-pass filter with cut-off wavelength near 600 nm is placed in front of the yellow emitter to achieve the desired red color. A short-wavelength-pass filter with cut-off wavelength near 600 nm is placed in front of the yellow emitter to achieve the desired green color. To maximize display efficiency and enrich the color gamut of the display, in the full-color pixel set, one could also add a fourth sub-pixel with the yellow emitter without an optical filter.

The desired objects of the instant invention are further achieved in accordance with a preferred method of fabricating a full-color active matrix organic light emitting display. The method includes the steps of providing a transparent substrate formed of one of glass, organic film, or a combination thereof and one of rigid or flexible, positioning a color filter on an upper surface of the substrate, depositing a spacer layer on the upper surface of the color filter, and forming a metal oxide thin film transistor backpanel on the spacer layer and defining an array of pixels. The method further includes the step of positioning an array of organic light emitting devices on the backpanel to emit light downwardly through the backpanel, the spacer layer, the color filter, and the substrate in a full-color display. The array of light emitted pixels is categorized in two subgroups with the first subgroup emitting in a first emitting wavelength zone and the second subgroup emitting in a second emitting wavelength zone, with the second wavelength being longer than the first wavelength. The light emitting layer in the OLED stacks responsible for the first emission zone is made with an un-patterned film forming method. While the second group of emitting pixels is formed with the corresponding light emission material patterned at full-color pixel level with thermal deposition through a shadow mask, or with one of the well known printing methods from an electroluminescent ink in gaseous, liquid or solid form.

The method also includes the step of forming the corresponding color filter in long-wavelength-pass, or short-wavelength-pass form. Placing such a filter set in front of the OLED with an emitting profile covering two color primaries, and form the emitting pixels with red, green, and blue color primaries without optical loss in the corresponding transmission zone. The method also includes adding a non-filtered OLED emitter to further improve display efficiency and color richness.

The spacer layer and the materials of the backpanel are selected to be substantially transparent to light emitted from the organic light emitting devices with larger aperture ratio. The metal oxide used in the thin film transistors of the backpanel is preferably amorphous (or with grain size in nanometer range, substantially smaller than TFT dimensions) to substantially improve the repeatability, or uniformity, and the reliability of the thin film transistors over the entire array or matrix.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which:

FIG. 2 is a circuit diagram of a single color element in accordance with the present invention;

FIG. 3 is a circuit diagram of another embodiment of a single color element in accordance with the present invention;

FIG. 4 is a simplified layer diagram representing layers in a full-color OLED pixel area within the OLED array;

FIG. 5 illustrates a color filter arrangement for the color filter of a single pixel matching the single OLED of FIG. 4;

FIG. 6 is a front view of the full-color pixel corresponding to the color filter arrangement illustrated in FIG. 5;

FIG. 7 is a simplified layer diagram representing layers in a single OLED of an OLED array;

FIG. 8 illustrates a color filter arrangement for the color filter of a single pixel matching the single OLED of FIG. 7; and FIG. 9 is a front view of the single pixel color filter arrangement illustrated in FIG. 8.

DETAILED DESCRIPTION OF THE DRAWINGS

Figure 1:
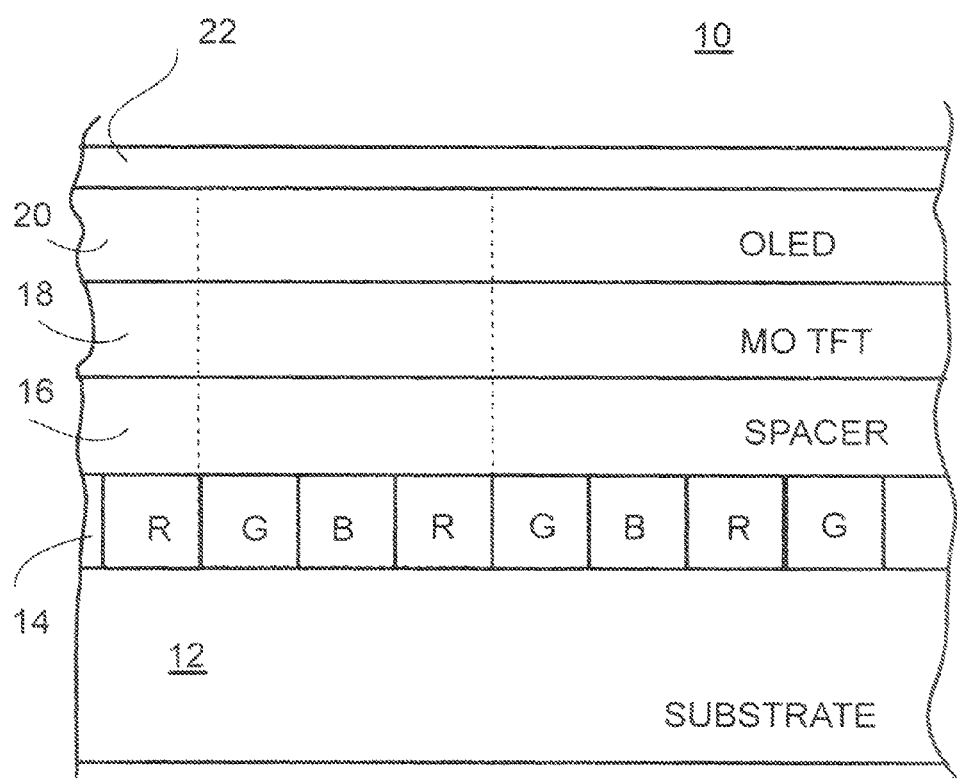
FIG. 1 is a simplified layer diagram of a display in accordance with the present invention.

Referring to FIG. 1, a simplified layer diagram of a display 10 in accordance with the present invention is illustrated. Display 10 includes a substrate 12 which in this embodiment is preferably glass but which could be any relatively rigid clear or transparent material, such as various plastics, etc. In the present context, the term "transparent" or "substantially transparent" is defined to mean material capable of optically transmitting light in the visible light range (400 nm to 700 nm) at greater than 70%. Further, it is intended that display 10 can be of a size similar to displays used in modern television, computer monitors, or portable electronics. The size of a full-color pixel comprising a set of red, green, and blue sub-pixels is of hundreds of microns for large size TV, or tens of microns for multi-medium, high information content mobile phones and the like. A color filter 14 is deposited on the upper surface of substrate 12 and generally, includes plastic material with a relatively low heat tolerance, i.e. generally below 250° C. Color filter 14 is fabricated in three-color pixels (red, green, blue) in a well known fashion, i.e. each pixel includes three color elements, each of which is controllable to add a selected amount of each color to produce any selected ultimate or combined color in accordance with well known procedures.

A spacer layer 16 is deposited on the upper surface of color filter 14 which provides several functions including planarization of color filter 14 and a more compatible interface (i.e. layer 16 ensures a better match, both chemically and optically, between materials at each interface. Because the various materials of color filter 14 are deposited in separate layers, planarization is preferred for a better surface for the deposition of the following components.

A metal oxide thin film transistor (MO TFT) layer 18 is formed on the upper surface of spacer layer 16. The metal oxide thin film transistors can be formed at relatively low temperatures (e.g. as low as room temperature) by processes such as physical vapor deposition, by a solution process including printing or coating, or by a surface chemical reaction. Printing includes any process such as ink jetting, dispensing, off-set printing, gravure printing, screen printing, etc. Coating includes any process such as slot coating, curtain coating, spray coating, etc. Physical vapor deposition includes any process such as sputtering, thermal deposition, e-beam deposition, etc. Surface chemical reaction includes surface reaction in gaseous or liquid environment.

In addition to planarization, spacer layer 16 provides heat protection for color filter 14 during fabrication of (MO TFT) layer 18. It has been found, for example, that annealing the metal oxide layer improves reliability and the characteristics of the transistors. This annealing procedure is performed by heating the gate metal of each of the transistors to over 300° C. with pulsed infra red energy. The heat absorbed by the gate metal anneals the metal oxide semiconductor adjacent the gate metal and spacer layer 16 protects the color filter from excessive heat (less than 250° C.). Additional information about this process can be found in a copending United States Patent Application entitled "Laser Annealing of Metal Oxide Semiconductor On Temperature Sensitive Substrate Formations", filed 21 May 2008, bearing Ser. No. 12/124,420, and included herein by reference. The metal oxide TFTs are formed in an amorphous metal oxide semiconductor, such as ZnO, InO, AlZnO, ZnInO, InAlZnO, InGaZnO, ZnSnO, GaSnO, InGaCuO, InCuO, AlCuO, etc. Here it should be understood that the term "amorphous" includes any semi-crystalline or non-crystalline metal oxide with grain size in the film plane significantly smaller than the TFT channel dimension. Because the amorphous metal oxide has small, standard grain size the characteristics of the TFTs formed in layer 18 are not substantially different from each other. Further, the metal oxide is transparent to light so that light can be transmitted downwardly through layer 18, layer 16, color filter 14 and substrate 12. Examples of materials that are preferable for spacer layer 16 include $SiO_2$, SiN, polyimide, BCB, or acrylic polymers.

The figure of merit in thin film transistors (TFTs) is defined by $\mu V/L^2$ where $\mu$ is the mobility, V is the voltage and L is the gate length. A major problem is partially remedied by the recent advance in metal oxide semiconductor materials in which mobility as high as 80 $cm^2$/V-sec has been demonstrated. One of the unique features of metal oxide semiconductors is that carrier mobility is less dependent on grain size of films, that is, high mobility amorphous metal oxide is possible. However, in order to achieve the high mobility required for high performance applications, the volume carrier density of the metal oxide channel should be high and the thickness of the metal oxide film should be small (e.g. <100 nm and preferably <50 nm). It has been found, however, that for these very thin channels, the interfacial interactions of the metal oxide with the underlying and overlaying material are no longer negligible.

The control of interfacial interactions can be implemented in either or both of two ways: (1) interaction with the underlying structure; and (2) interaction with the overlying structure. To fabricate TFTs, any or all of the following functions for the overlying and the underlying structures may be used. For example, different functions may be used on different portions or surfaces of a TFT. As examples of uses of the different functions, weak interaction can be used to adjust the threshold of the TFT and strong interactions are preferred for the good ohmic contacts in the source/drain regions. Some possible functions of overlying structures include: (1) passivation—provides weak or no interaction; (2) Gate—provides weak or no interaction; and (3) source/drain—provide strong interaction. Also, some possible functions of underlying structures include: (1) passivation—provides weak or no interaction; (2) Gate—provides weak or no interaction; and (3) source/drain—provide strong interaction. The functions of overlying and underlying structures needed for any specific embodiment of a TFT depends on the configuration of the TFT. Multiple functions may be needed for either the overlying or the underlying structure. Additional information on the control of interfacial interactions can be found in copending United States Patent Application entitled "Metal Oxide TFT with Improved Carrier Mobility", bearing Ser. No. 12/173,995, filed on 16 Jul. 2008 and incorporated herein by reference.

A layer 20 of organic light emitting devices (OLEDs) is formed on the surface of MO TFT layer 18 so that light generated in OLED layer 20 is directed downwardly through MO TFT layer 18, spacer 16, color filter 14 and substrate 12. OLED layer 20 comprises a stack of organic materials (details to be described in conjunction with FIGS. 4 and 7 below) between two contact electrodes on top and bottom. The bottom electrodes are patterned and connected with pixel drivers formed in layer 18, an array of OLEDs can be formed and addressed accordingly by MO TFT layer 18. A full-color AMOLED could be achieved with a non-patterned organic stack in OLED layer 20, along with a set of red, green, and blue color filters in layer 14 by using only white light emitting OLEDs. Display efficiency is the contemporary challenge for this approach because approximately ⅔ of the emitted light from a white emitter is cut-off (filtered) from the front view of the display. Moreover, the transmission profile in the needed emission zone of the color primaries also needs to be shaped by means of absorption methods to achieve the needed purity for the color primaries. As a result, red, green, and blue color pixels produced from a white OLED emitter plus an absorption type of color filter set do not provide the needed power efficiency for product design, especially for portable displays powered with rechargeable batteries. One improvement in this approach is to add in a non-filtered white OLED sub-pixel in addition to the red, green, and blue primary color sub-pixels to form a 4 sub-pixel full-color pixel set.

Full-color AMOLED can also be made with a set of OLED emitting in red, green, and blue zones. With sufficient color purity, no color filter layer is needed. Patterning the light emission layer with different materials to the sub-pixel level is often made with a shadow mask with windows corresponding to the emitting pad areas of the targeting sub-pixel. The challenge for this approach is that at least three deposition chambers and three fine mask sets are required for the three color emission layers. Other layers in the OLED stack may also need to be patterned when the performance of the red, green, and blue OLED emitting elements are fully optimized. In addition, alignment among the masks during the OLED fabrication is tedious and is the major yield loss factor in making full-color displays. Equipment cost, process throughput and large-size, and fine shadow masking are also challenging factors in this approach.

Originally this application disclosed a full-color AMOLD with a non-patterned OLED layer 20 providing sky-blue color emission (blue-green color emission in 400-600 nm wavelength). A blue color sub-pixel is then formed from the sky-blue OLED with a short-wavelength-pass color filter in layer 14 with a cut-off wavelength at approximately 500 nm. A green color sub-pixel is formed from the sky-blue OLED with a long-wavelength-pass color filter in layer 14 with a cut-off wavelength of approximately 500 nm. The red color sub-pixel is formed by an energy down-conversion color filter in layer 14 at the corresponding locations in a color display. The energy down-conversion color filter absorbs the sky-blue light emitted by the OLED and emits light in the 600-700 nm region in response thereto. This approach relies on an energy conversion color filter with good energy match between the color filter and the sky-blue OLED emitter, good absorption efficiency in the filter layer, and high conversion efficiency.

To further improve the power efficiency of AMOLED provided from this approach, a non-filtered sky-blue sub-pixel can also be added in the full-color pixel. Full-color display elements with four sub-pixels in blue, green, red, and sky-blue colors are thus formed. The unfiltered sub-pixel improves the display power efficiency along with enrichment of the color.

In the present invention, a full-color AMOLED display structure is disclosed along with corresponding methods of fabrication including producing an OLED array in layer 20 with two emission colors made with a single fine patterning process. This approach eliminates the need for alignment among different fine masks and thus eliminates color crosstalk between neighboring sub-pixels. By combining the two-color layer 20 with corresponding long-wavelength-pass or short-wavelength-pass filters in layer 14, full-color AMOLED displays can be achieved with low fabrication cost, high color gamut, and the high power efficiency needed for high information content displays of all sizes.

In conjunction with the two emission color OLED made with a single fine patterning process, one approach to achieve the red color sub-pixel with high efficiency is to insert a patterned red emission layer at the corresponding locations in the non-patterned organic layers for the sky-blue OLED. Such single step fine patterning in full-color pixels does not generate the alignment complexity seen in multiple fine patterning for red, green, and blue colored emitters in the prior art but retains simplicity in obtaining full-color pixels in AMOLED displays.

Generally, two specialized examples of full-color OLED displays including a hybrid structure and process are disclosed below. Each of the two examples include two of the color primaries defined by an OLED emitter with an emission zone covering the range of two primary colors and a patterned emission layer with an emission covering the third primary color positioned in the emission zone. A set of long-wavelength-pass and short-wavelength-pass optical filters separate the emission in the emission zone into the two primary colors.

A first specialized type of OLED generator 50 and color filter 60 in accordance with the present invention is illustrated in FIGS. 4-6. Referring specifically to FIG. 4, a simplified layer diagram representing layers in single OLED 50 of an OLED array (corresponding to layer 20 in FIG. 1) is illustrated. In this specific example, OLED 50 includes a cathode 52, an electron injection layer 53 and an electron transport layer 54. This specific arrangement of OLEDs includes a patterned anode pad corresponding to each sub-pixel (explained above and not shown), a hole injection layer 55, and a hole transport layer 56. It will be understood that many of these various layers can be individually provided (as shown) or combined with or into other layers and the various layers illustrated are simply for example. Light emission layers 57 and 58 are provided between electron transport layer 54 and hole transport layer 56. In certain specific applications, layer 58 can alternatively be inserted between layer 57 and electron transport layer 54. While a bottom anode is illustrated and described, it will be understood that a bottom common cathode configuration could be used by reversing the OLED stack. It should be specifically noted that all of the organic layers (53, 54, 55, 56, and 57) are deposited without fine patterning at the pixel level. Only layer 58 requires patterning which can be achieved with thermal deposition through a fine-shadow-mask or by means of a printing method known to the skilled artisan in the field.

As understood in the art, electrons and holes combine in the emission layer to generate photons or light that is then emitted in a specific direction, in this case in the direction of the anode. Further, the color of the light emitted can be controlled or selected in accordance with the material incorporated into light emission layers 57 and 58. In this embodiment, light emission layer 57 is constructed to emit blue-green (skyblue) light in a range or band of approximately 400 nm to 600 nm. The blue-green emitter can be made with a single emitter with broad emission profile covering blue and green colors or with blue and green emitters in a bilayer or in a blend form and could also be made in a green and a blue OLED stacking form. Second light emission layer 58 is constructed to emit light generally in the range or band of red light and is much smaller than light emission layer 57. Second light emission layer 58 is patterned on light emission layer 57 by some convenient means such as: thermal deposition with a fine mask, by one of printing or coating processes (see description above) including inkjet printing, solution dispensing, transfer printing, offset printing etc.; laser induced thermal transfer; or contact printing. The un-patterned layer 57, in the area of the stack including patterned red emission layer 58, serves electron transport and hole blocking functions in the red emission sub-pixel locations. It should be noted that only one fine patterning step is involved in this novel process and all of the remaining layers in the OLED stack are made without the requirement of fine patterning versus three fine patterning steps required in the prior art.

It should be noted that the energy level of carriers in red emission layer 58 is lower than the energy level of carriers in sky-blue emission layer 57. Therefore, carriers tend to migrate through sky-blue emission layer 57 and into the lower energy level of red emission layer 58, where they combine in a well known fashion to produce red light. Thus, in the area where red emission layer 58 is positioned on sky-blue emission layer 57, substantially only red emissions occur and sky-blue emission layer 57 provides only electron transport and hole blocking functions.

Referring additionally to FIGS. 5 and 6, color filter arrangement 60 for a single full-color pixel for use in conjunction with an array of OLED generators 50 is illustrated. Color filter 60 is illustrated with an optional black matrix or surround pattern having four openings or zones: a blue color zone 62, a red color zone 63, a green color zone 64, and an optional skyblue color zone 65. In this embodiment, blue color zone 62 is formed by a magenta color filter or a short-wavelength-pass filter which absorbs light in the range of approximately 500 nm to 600 nm and passes only blue color in a wavelength range shorter than 500 nm. Green color zone 64 is formed by a yellow color filter which absorbs light in a range shorter than 500 nm and passes light with a wavelength longer than 500 nm. Red color zone 63 has either no color filter or a filter trimming the red emission profile toward a red color standard required by NTSC. The optional skyblue zone has no color filter so as to pass the original emission profile from layer 57.

Thus, specialized type of OLED generator 50 and matching color filter 60 in accordance with the present invention are illustrated and disclosed. Generally, color filter 60 will be positioned on a transparent substrate as illustrated in FIG. 1. A spacer layer and/or an optional planarization layer may be positioned on the color filter or may be considered a portion of the color filter. A metal oxide thin film transistor (MO TFT) layer is formed on the upper surface of the spacer layer or on the color filter, if the spacer layer is not present or is formed as a component of the color filter. A layer of organic light emitting devices (OLEDs) is formed on the surface of the MO TFT layer so that light generated in the OLED layer is directed downwardly through the MO TFT layer, the color filter, and the substrate. As will be understood from the above description, in the manufacturing of OLED generator 50 only one fine patterning step is involved which substantially reduces process cost and yield loss and substantially improves display resolution.

A second specialized type of OLED generator 70 and color filter 80 in accordance with the present invention is illustrated in FIGS. 7-9. OLED generator 70 and color filter 80 are incorporated into a display generally as described above with relation to OLED generator 50 and color filter 60. Referring specifically to FIG. 7, a simplified layer diagram representing layers in single OLED 70 of an OLED array (corresponding to layer 20 in FIG. 1) is illustrated. In this specific example, OLED 70 includes a common cathode 72, an electron injection layer 73 and an electron transport layer 74. This specific arrangement of OLEDs includes an array of anode pads connected to corresponding pixel drivers at the same sub-pixel location (explained above and not shown), a hole injection layer 75, and a hole transport layer 76. It will be understood that many of these various layers can be individually provided (as shown) or combined with or into other layers and the various layers illustrated are simply for example. Light emission layers 77 and 78 are provided between electron transport layer 74 and hole transport layer 76. While a bottom anode configuration is illustrated and described, it will be understood that a bottom cathode configuration could also be used by reversing the OLED stack.

As explained above, the color of the light emitted can be controlled or selected in accordance with the material incorporated into light emission layers 77 and 78. In this embodiment, light emission layer 77 is constructed to emit blue light in a range or band of approximately 400 nm to 500 nm. It is deposited without patterning at the pixel level, similar to other layers in the OLED layer stack other than emission layer 78. Second light emission layer 78 is constructed to emit yellow (green-red) light in a range or band of approximately 500 nm to 700 nm and is deposited by thermal deposition with a fine mask or by a fine printing method known to artisans in the field. The yellow (green-red) emitter can be made with a single emitting material with broad emission in the 500-700 nm range, or with green and red emitters in a bilayer or in a blend form and could also be made in a green and a red OLED stacking form. Second light emission layer 78 is patterned on blue light emission layer 77 by some convenient means such as: thermal deposition with a fine mask, by one of printing or coating processes (see description above) including inkjet printing, solution dispensing, transfer printing, offset printing etc.; laser induced thermal transfer; or contact printing. In the OLED pixel with patterned layer 78 providing yellow emission, the layer 77 covered by the patterned layer 78 becomes an electron transport and hole blocking layer in the stack because of the difference in energy levels (described above). In specific applications, the order of layer 78 and layer 77 can be reversed, based on the relative energy level structures and carrier transport characteristics.

Referring additionally to FIGS. 8 and 9, a color filter arrangement 80 for a single full-color pixel for use in conjunction with an array of OLED generators 70 is illustrated. Color filter 80 is illustrated with an optional black matrix or surround pattern having three openings or zones: a blue color zone 82, a green color zone 83, and a red color zone 84. In this embodiment, blue color zone 82 has no filters and simply passes blue light generated from light emission layer 77. A color trimming/shaping filter could also or alternatively be placed in the zone 82 to optimize the emission color of the blue color. Green color zone 83 is formed by placing a short-wavelength-pass filter (which absorbs light only for wavelengths longer than approximately 600 nm) in front of the yellow OLED emitter. Red color zone 84 is formed by placing a long-wavelength-pass filter (which absorbs light only for wavelengths shorter than approximately 600 nm) in front of the yellow OLED emitter. The drawings in FIGS. 8 and 9 depict a full-color pixel comprising red, green, and blue sub-pixels as color primaries of the AMOLED display. An additional fourth sub-pixel with unfiltered yellow OLED emission could be added to the full-color set to increase display power efficiency and color richness.

Thus, specialized type of OLED generator 70 and matching color filter 80 in accordance with the present invention are illustrated and disclosed. As will be understood from the above description, in the manufacturing of OLED generator 70 only one fine patterning step is involved. Also, the fine patterning step covers two sub-pixels so that less process accuracy is demanded. Thus, this process involves less fine patterning which substantially reduces process cost and yield loss and substantially improves display resolution.

Thus, in this disclosure the term "full-color" display is defined to mean a display in which the pixels include at least the three different color elements, red, green, and blue and in some specific applications a fourth emitter sub-pixel passing the unfiltered, broad OLED emission.

It is important to understand that the organic layers in the OLED stack (see FIGS. 4 and 7) are made without patterning except layer 58 and layer 78, respectively. Such structure and corresponding process provide great simplicity over traditional full-color OLED forming methods from patterned red, green, and blue emitter layers at the pixel level. No cross-alignment among fine masks is needed in this new method. Generally, a seal or protective coating 22 is formed over the entire structure to seal the OLEDs from the surrounding atmosphere, which can be detrimental to continued operation.

Thus, a display using low power, high output OLEDs can be manufactured relatively inexpensively. Further, with this invention it is possible to make the single patterning mask over large size displays and thus manufacture displays large enough to compete with present day television screens, computer monitors typically made from glass with a size in meter length ranges (Generation-V line or higher). On the other hand, since the single patterning process eliminates alignment errors generated in multiple fine mask processes, with a pattern covering two sub-pixels (rather than one in the prior art), a full-color display can be achieved with finer pitch size; enabling high information content and digital display formats in portable display products. Large size, full-color AMOLED or high pixel density small size displays were not possible using the prior art multiple fine-shadow-mask process or the like. Also, it is known that OLEDs can be operated with relatively low power and they produce or generate relatively high amounts of light. Adding unfiltered broad-band OLED sub-pixels into full-color emitter set further improves display power efficiency and color richness.

The metal oxide thin film transistors used in backpanel 18 are deposited at low (e.g. room) temperature and require a minimum of operations. For example, MO TFT backpanel 18 can be manufactured using four photo masks and, if the compound semiconductor pattern is formed by a printing process (e.g. ink jetting, dispensing, off-set printing, gravure printing, screen printing, etc.), the backpanel can be completed with three photo masks. Further, the characteristics of the TFTs can be enhanced by annealing and control of interfacial interactions performed without overheating color filter 14 in accordance with the described procedures. The relatively high mobility of the metal oxide semiconductor material and the low leakage current (low OFF current) allows the use of small size storage capacitors, which can be overlaid with the power line to further increase space available for the emitter pad and thus the aperture ratio of the sub-pixel. The low leakage and simplified manufacturing techniques can be further enhanced by selectively anodizing the gate metal material at low temperature to form the gate dielectric at the transistor channel area and the capacitor area. In a preferred embodiment, an active matrix organic light emitting diode pixel driver (backpanel) was constructed with an aperture ratio larger than 50% and only the metal power lines and the TFT areas are opaque to visible light so that the remaining area can be used to define the emitter pad. In a specific embodiment the selection line, the data line and the power line were formed of opaque metal and used as a mask for pixel electrode patterning. A transparent pixel electrode is deposited and patterned over the transparent area of each pixel or through a self-aligned patterning process from the back side. For a display with 100 ppi full-color pixels, 85 µm by 255 µm sub-pixel area greater than an 80% aperture ratio was achieved.

In one example, the TFTs were made with Al as the gate electrode and AlO as the gate insulator. Indium-tin-oxide (ITO) or aluminum was used as the source and drain electrodes. In—Zn—O or I—Al—Zn—O was sputtered and patterned over the channel and source/drain area. The width and the length of the channel were 200 µm and 20 µm, respectively. All the deposition and patterning processes were carried out without substrate or color filter heating. A post baking was carried out at 150° C. for 30-90 minutes. At least one TFT in each element had n-type characteristics, with ON current at 20V of approximately 0.5 mA and OFF current at −20V of a few picoamps. The ON/OFF ratio was over $10^7$ at 20V and the electron mobility was observed in a range of 5 $cm^2$/Vsec to 20 $cm^2$/Vsec. This example demonstrates the high mobility, high switch ratio TFTs that can be fabricated with amorphous metal oxide semiconductor material at low temperatures. Such low process temperature allows metal-oxide based TFTs to be used for electronic circuits on flexible plastic substrates.

Turning now to FIG. 2, a circuit diagram of a single color element, designated 30, in a pixel is illustrated. As will be understood from the disclosure, the two transistors, one capacitor, three bus line element 30 is possible because of the novel construction and the use of metal oxide semiconductor transistors. Pixel 30 is a common cathode arrangement wherein all of the cathodes of all of the elements in the array are connected to a common terminal or conductor. It will be understood that, three color elements similar to color element 30 are incorporated in each full-color pixel to illuminate the red/green/blue colors for each pixel. As understood by those skilled in the art, a full-color display incorporates an array of pixels generally oriented in rows and columns, with each full-color pixel including three primary color elements, each element in association with one of a red, green, or blue area of color filter 14. As disclosed as a part of this invention, unfiltered broad-emission from the OLEDs can be added into each full-color pixel set to increase display power efficiency and color richness (gamut).

Color element 30 is coupled between a data line 32 and a selection line 34. Each pixel in the column with element 30 is coupled to data line 32 and to a separate selection line 34. Similarly, each element in the row with element 30 is coupled to selection line 34 and to a different data line. Thus, by addressing data line 32 and selection line 34, pixel 30 is specifically selected. In a similar fashion each element in the array can be selected or addressed and the brightness controlled by a signal on the data line.

The control circuit of element 30 includes a switching transistor 36, a current regulator or driver transistor 38, and a storage capacitor 40. The gate of switching transistor 36 is connected to selection line 34 and the source-drain are connected between data line 32 and the gate of driver transistor 38. An OLED 42 that is being controlled by the control circuit has the cathode connected to the common terminal or conductor and the anode is connected through the source-drain of driver transistor 38 to a power source, Vdd. Storage capacitor 40 is connected between the power source, Vdd, and the gate of driver transistor 38.

Thus, when a select signal appears on selection line 34 and a data signal appears on data line 32, pixel 30 is addressed or selected. The signal on selection line 34 is applied to the gate of switching transistor 36, turning on the transistor. The data signal on data line 32 is applied through the source-drain of switching transistor 36 to the gate of driver transistor 38, turning driver transistor ON according to the amplitude and/or duration of the data signal. Driver transistor 38 then supplies power, generally in the form of driving current, to OLED 42, the brightness or intensity of light generated by OLED 42 depends upon the amount and/or duration of current supplied. Because of the efficiency of OLED 42 the driving current, i.e. the element current provided by driver transistor 38, is generally in a range of sub microampere to a few microamperes. Storage capacitor 40 memorizes the voltage on data line 32 after switching transistor 36 is turned off.

Turning now to FIG. 3, a circuit diagram of another embodiment of a single color element, designated 30', in a pixel is illustrated. In this embodiment components similar to those in FIG. 2 are designated with similar numbers and a prime (') is added to each number to indicate the different embodiment. Pixel 30' is a common anode arrangement wherein all of the anodes of all of the elements in the array are connected to a common terminal or conductor. Color element 30' is coupled between a data line 32' and a selection line 34'. Each pixel in the column with element 30' is coupled to data line 32' and to a separate selection line 34'. Similarly, each element in the row with element 30' is coupled to selection line 34' and to a different data line. Thus, by addressing data line 32' and selection line 34', pixel 30' is specifically selected. In a similar fashion each element in the array can be selected or addressed and the brightness controlled by a signal on the data line.

The control circuit of element 30' includes a switching transistor 36', a current regulator or driver transistor 38', and a storage capacitor 40'. The gate of switching transistor 36' is connected to selection line 34' and the source-drain are connected between data line 32' and the gate of driver transistor 38'. An OLED 42' that is being controlled by the control circuit has the anode connected to the common terminal or conductor and the cathode is connected through the source-drain of driver transistor 38' to a power source, Vss. Storage capacitor 40' is connected between the power source, Vss, and the gate of driver transistor 38'.

Thus, a full-color active matrix organic light emitting display is disclosed that includes a transparent substrate, a color filter positioned on an upper surface of the substrate, a spacer layer formed on the upper surface of the color filter, a metal oxide thin film transistor backpanel formed on the spacer layer and defining an array of pixels, and an array of organic light emitting devices formed on the backpanel and positioned to emit visible light in two emission profiles downwardly through the backpanel, the spacer layer, the color filter, and the substrate in a full-color display. The combination of the color filter and the array of organic light emitting devices made with a single fine-patterning step allows the simplified manufacture of organic light emitting devices and, therefore the use of the devices. Also, the metal oxide thin film transistor backpanel allows the light to be transmitted down through the backpanel and the substrate to substantially increase the aperture ratio for a substantial reduction in pixel size (or improvement in light emission).

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A full-color active matrix organic light emitting display comprising:
   an array of full-color display pixels;
   each full-color display pixel including sub-pixels providing red, green, and blue primary colors, each subpixel including at least one organic light emitting diode with an emission profile; and
   each full-color display pixel including at least two organic light emitting diodes defining at least two subpixels, the at least two organic light emitting diodes emitting a first light emission band with wavelengths substantially extending across the range of two of the three primary colors, wherein each full color display pixel further includes at least one organic light emitting diode defining at least one subpixel, the at least one organic light emitting diode emitting a second light emission band with wavelengths substantially extending across the range of a third primary color of the three primary colors.

2. The full-color active matrix organic light emitting display as claimed in claim 1, wherein the first light emission band includes shorter wavelengths than the second light emission band.

3. The full-color active matrix organic light emitting display as claimed in claim 2, wherein the first light emission band includes a range of wavelengths of approximately 400 nm to 600 nm and the second light emission band includes a range of wavelengths of approximately 600 nm to 700 nm.

4. The full-color active matrix organic light emitting display as claimed in claim 1, wherein the first light emission band includes longer wavelengths than the second light emission band.

5. The full-color active matrix organic light emitting display as claimed in claim 4, wherein the first light emission band includes a range of wavelengths of approximately 500 nm to 700 nm and the second light emission band includes a range of wavelengths of approximately 400 nm to 500 nm.

6. The full-color active matrix organic light emitting display as claimed in claim 1, further including a color filter array layer positioned between a viewer's eye and the organic light emitting diodes converting light emission in the first light emission band into two of the three primary colors.

7. The full-color active matrix organic light emitting display as claimed in claim 6, wherein the color filter array layer positioned between the viewer's eye and the organic light emitting diodes includes a short-wavelength-pass optical color filter and a long-wavelength-pass optical color filter with cut-off edges midway in the first light emission band.

8. The full-color active matrix organic light emitting display as claimed in claim 7, wherein the cut-off edges of the short-wavelength-pass optical color filter and the long-wavelength-pass optical color filter are at approximately 500 nm and an emission profile of the corresponding at least two organic light emitting diodes emitting the first light emission band includes a range of wavelengths of approximately 400 nm to 600 nm.

9. The full-color active matrix organic light emitting display as claimed in claim 7, wherein the cut-off edges of the short-wavelength-pass optical color filter and the long-wavelength-pass optical color filter are at approximately 600 nm and the emission profile of the corresponding at least two organic light emitting diodes emitting the first light emission band includes a range of wavelengths of approximately 500 nm to 700 nm.

10. The full-color active matrix organic light emitting display as claimed in claim 6, wherein each full-color display pixel includes at least one additional sub-pixel positioned to emit light directly, not through the color filter array layer.

11. The full-color active matrix organic light emitting display as claimed in claim 10, wherein the emission profile of the at least one additional sub-pixel positioned to emit light directly includes one of the first light emission band, the second light emission band, or both.

12. The full-color active matrix organic light emitting display as claimed in claim 1, further including an array of pixel driving circuits connected to control each sub-pixel, each pixel driving circuit including at least one thin film transistor.

13. The full-color active matrix organic light emitting display as claimed in claim 1, further including an array of pixel driving circuits connected to control each sub-pixel, each pixel driving circuit including at least one switch thin film transistor, one driving thin film transistor, and one storage capacitor.

14. The full-color active matrix organic light emitting display as claimed in claim 13, wherein the one driving thin film transistor has an active channel including at least a semiconductor metal oxide film.

15. A full-color active matrix organic light emitting display comprising:
an array of full-color display pixels, each full-color display pixel including sub-pixels formed from organic light emitting devices in an array of organic light emitting devices, each organic light emitting device having an emission profile and an emission zone;
each full-color display pixel including two groups of sub-pixels, having corresponding two groups of the organic light emitting device emission zones, each sub-pixel including at least one organic light emitting diode with a light emission profile;
the emission zone of a first group of the two groups including a blanket emission layer without pixel level patterning and providing one of a first light emission band and a second light emission band; and
the emission zone of a second group of the two groups including another emission layer patterned within each full-color pixel and providing another of the first light emission band and the second light emission band.

16. The full-color active matrix organic light emitting display as claimed in claim 15, wherein the patterned emission layer is in contact with the blanket emission layer without pixel level patterning.

17. The full-color active matrix organic light emitting display as claimed in claim 16, wherein the blanket emission layer without pixel level patterning serves charge transfer and/or charge block functions in an area in contact with the patterned emission layer.

18. The full-color active matrix organic light emitting display as claimed in claim 17, wherein the light emission wavelength of the blanket emission layer without pixel level patterning is shorter than the light emission wavelength of the patterned emission layer.

19. The full-color active matrix organic light emitting display as claimed in claim 16, wherein the second light emission band is emitted from the blanket emission layer without pixel level patterning and extends in a range of approximately 400 nm to 500 nm, the patterned emission layer emitting the first light emission band that extends in a range of approximately 500 nm to 700 nm.

20. The full-color active matrix organic light emitting display as claimed in claim 16, wherein the first light emission band is emitted from the blanket emission layer without pixel level patterning and extends in a range of approximately 400 nm to 600 nm, the patterned emission layer emitting the second light emission band that extends in a range of approximately 600 nm to 700 nm.

21. The full-color active matrix organic light emitting display as claimed in claim 16, wherein the patterned emission layer includes a printed or coated layer formed by one of inkjet printing, solution dispensing, transfer printing, offset printing, laser induced thermal transfer, and contact printing.

22. The full-color active matrix organic light emitting display as claimed in claim 16, wherein the patterned emission layer includes a thermally deposited layer with patterns defined by a shadow mask.

23. The full-color active matrix organic light emitting display as claimed in claim 15, further including a color filter array layer positioned between a viewer's eye and the organic light emitting devices converting light emission in the first light emission band into two of the three primary colors.

24. The full-color active matrix organic light emitting display as claimed in claim 23, wherein the color filter array layer positioned between the viewer's eye and the organic light emitting devices includes a short-wavelength-pass optical color filter and a long-wavelength-pass optical color filter with cut-off edges midway in the first light emission band.

25. The full-color active matrix organic light emitting display as claimed in claim 24, wherein the cut-off edges of the short-wavelength-pass optical color filter and the long-wavelength-pass optical color filter are at approximately 500 nm and an emission profile of at least two organic light emitting diodes in each pixel includes a range of wavelengths of approximately 400 nm to 600 nm.

26. The full-color active matrix organic light emitting display as claimed in claim 24, wherein the cut-off edges of the short-wavelength-pass optical color filter and the long-wavelength-pass optical color filter are at approximately 600 nm and an emission profile of at least two organic light emitting diodes in each pixel includes a range of wavelengths of approximately 500 nm to 700 nm.

27. The full-color active matrix organic light emitting display as claimed in claim 23, wherein each full-color display pixel includes at least one additional subpixel positioned to emit light directly, not through the color filter array layer.

28. The full-color active matrix organic light emitting display as claimed in claim 27, wherein the emission profile of the at least one additional sub-pixel positioned to emit light directly includes one of the first light emission band, the second light emission band, or both.

29. The full-color active matrix organic light emitting display as claimed in claim 23 wherein the color filter array layer further includes a black matrix surrounding the emission zone of each organic light emitting device.

30. The full-color active matrix organic light emitting display as claimed in claim 15, wherein the first group of the two groups of sub-pixels includes one of blue and green organic light emitting diodes in a bilayer, blue and green organic light emitting diodes in a blend form, and blue and green organic light emitting diodes in a stacking form.

31. The full-color active matrix organic light emitting display as claimed in claim 15, further including an array of pixel driving circuits connected to control each sub-pixel, each pixel driving circuit in the array of pixel driving circuits including at least one thin film transistor.

32. The full-color active matrix organic light emitting display as claimed in claim 31, further including an array of pixel driving circuits connected to control each sub-pixel, each pixel driving circuit including at least one switch thin film transistor, one driving thin film transistor, and one storage capacitor.

33. The full-color active matrix organic light emitting display as claimed in claim 32, wherein the one driving thin film transistor has an active channel including at least a semiconductor metal oxide film.

34. A full-color active matrix organic light emitting display comprising:
an array of full-color display pixels, each full-color display pixel including at least one organic light emitting diode with an emission profile across 200 nm in visible spectrum and at least one organic light emitting diode with an emission profile across 100 nm in visible spectrum;
an array of pixel driving circuits, connected to the array of full-color display pixels, and controlling the organic light emitting diodes in each pixel of the array of full-color display pixels; and
each pixel driving circuit of the array of pixel driving circuits including at least one thin film transistor.

35. The full-color active matrix organic light emitting display as claimed in claim 34, wherein the emission profile of the at least one organic light emitting diode with an emission profile across 200 nm in visible spectrum is in a range of approximately 500 nm to 700 nm.

36. The full-color active matrix organic light emitting display as claimed in claim 34, wherein the emission profile of the at least one organic light emitting diode with an emission profile across 200 nm in visible spectrum is in a range of approximately 400 nm to 600 nm.

37. The full-color active matrix organic light emitting display as claimed in claim 34, wherein each pixel driving circuit of the array of pixel driving circuits includes at least one switch thin film transistor, one driving thin film transistor, and one storage capacitor.

38. The full-color active matrix organic light emitting display as claimed in claim 37, wherein the at least one thin film transistor of each pixel driving circuit of the array of pixel driving circuits includes an active channel comprising at least a semiconductor metal oxide film.

\* \* \* \* \*